(12) United States Patent
Liao et al.

(10) Patent No.: US 8,372,706 B2
(45) Date of Patent: Feb. 12, 2013

(54) SEMICONDUCTOR DEVICE FABRICATION METHOD INCLUDING HARD MASK AND SACRIFICIAL SPACER ELEMENTS

(75) Inventors: Shun-Jang Liao, Pingjhen (TW); Sheng-Chen Chung, Jhubei (TW); Kong-Beng Thei, Hsin-Chu County (TW); Harry Chuang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/218,720

(22) Filed: Aug. 26, 2011

(65) Prior Publication Data

US 2011/0312141 A1 Dec. 22, 2011

Related U.S. Application Data

(62) Division of application No. 12/270,466, filed on Nov. 13, 2008, now Pat. No. 8,008,145.

(60) Provisional application No. 61/095,844, filed on Sep. 10, 2008.

(51) Int. Cl.
*H01L 21/8238* (2006.01)

(52) U.S. Cl. ........... 438/199; 438/652; 257/E21.19; 257/E21.409

(58) Field of Classification Search ........... 438/199, 438/585, 652, 656; 257/E21.19, E21.409
See application file for complete search history.

(56) References Cited

U.S. PATENT DOCUMENTS

| | | | |
|---|---|---|---|
| 6,797,572 | B1 | 9/2004 | Jeon et al. |
| 7,799,630 | B2 | 9/2010 | Yu et al. |
| 7,902,058 | B2 * | 3/2011 | Datta et al. ................... 438/592 |
| 2006/0189061 | A1 | 8/2006 | Amos et al. |
| 2006/0286729 | A1 | 12/2006 | Kavalieros et al. |
| 2007/0215950 | A1 | 9/2007 | Aoyama |
| 2008/0083948 | A1 | 4/2008 | Lin et al. |
| 2010/0052074 | A1 | 3/2010 | Lin et al. |

OTHER PUBLICATIONS

Chinese Patent Office, Office Action dated Nov. 10, 2010, Application No. 200910163899.8, 5 pages.

* cited by examiner

*Primary Examiner* — Hsien Ming Lee
(74) *Attorney, Agent, or Firm* — Haynes and Boone, LLP (57) ABSTRACT

Provided is a method of fabricating a semiconductor device. A first hard mask layer is formed on a substrate. A second hard mask layer s formed the substrate overlying the first hard mask layer. A dummy gate structure on the substrate is formed on the substrate by using at least one of the first and the second hard mask layers to pattern the dummy gate structure. A spacer element is formed adjacent the dummy gate structure. A strained region on the substrate adjacent the spacer element (e.g., abutting the spacer element). The second hard mask layer and the spacer element are then removed after forming the strained region.

20 Claims, 9 Drawing Sheets

SEMICONDUCTOR DEVICE FABRICATION METHOD INCLUDING HARD MASK AND SACRIFICIAL SPACER ELEMENTS

CROSS REFERENCE TO RELATED APPLICATIONS

This application is a divisional of application Ser. No. 12/270,466 filed Nov. 13, 2008, now U.S. Pat. No. 8,008,145, which claims priority to Provisional Application Ser. No. 61/095,844 filed on Sep. 10, 2008, entitled "HIGH-K METAL GATE STRUCTURE FABRICATION METHOD INCLUDING HARD MASK", the entire disclosures of which are incorporated herein by reference.

BACKGROUND

The present disclosure relates generally to an integrated circuit (IC) device and, more particularly, a method of forming a high-k metal gate structure of an IC device.

The semiconductor industry has employed several strategies to meet the demands for decreasing sizes of integrated circuits. One such strategy is the use of high-k materials for gate dielectrics. High-k gate dielectrics include those dielectric materials having a higher dielectric constant than silicon oxide, a conventional gate dielectric. High-k gate dielectrics allow a thicker gate dielectric layer (e.g., as compared to $SiO_2$) to provide a similar equivalent oxide thickness (EOT). The thicker layer allows for increased reliability and lower leakage currents. Recent trends in semiconductor fabrication have also employed metal gate technologies. Metal gates allow for lower resistance than conventional polysilicon gates. Metal gates may also be compatible with the underlying high-k dielectrics.

However, the fabrication processes providing for use of a high-k dielectric plus metal gate structure face challenges. "Gate-last" processes have been developed that provide for reduced risk of damage to the final gate structure, for example, during high temperature processes of forming the gate stack. A gate-last process includes the formation of a dummy polysilicon gate on a substrate, the dummy gate includes a sacrificial structure which is replaced by a metal gate structure. In a gate-last process however, several processing issues remain including, for example, those associated with a chemical mechanical polish (CMP) process and the interlayer dielectric (ILD) deposition between gates (e.g., reducing voiding).

Therefore, what is needed is an improved method of forming a gate structure.

SUMMARY

In one embodiment, a method of fabricating a semiconductor device is provided. A substrate is provided and includes a dummy gate structure. A hard mask layer is disposed on the dummy gate structure. A dielectric layer is deposited on the substrate. The dielectric layer is planarized using the hard mask layer as a stop layer. The hard mask layer is removed. In one embodiment, the hard mask layer is removed by continuing to planarize the dielectric layer past the stop layer.

In another embodiment, a method of fabricating a semiconductor device is provided. The method includes providing a substrate including a dummy gate structure disposed on the substrate. A first and a second hard mask layer are provided on the dummy gate structure. A strained region is formed on the substrate adjacent the dummy gate structure. In an embodiment, the strained region includes a SiGe epi layer. The second mask layer is removed after forming the strained region. A source and a drain region are formed in the strained region after removing the second mask layer. A dielectric layer is deposited. At least a portion of the deposited dielectric layer is removed using the first hard mask layer as a stop layer.

In yet another embodiment, a method of fabricating a semiconductor device is provided including forming a sacrificial polysilicon gate on a substrate. The forming the sacrificial polysilicon gate on the substrate includes using at least one of a first and a second hard mask layer to pattern the sacrificial polysilicon gate. A source and a drain region are formed adjacent the sacrificial polysilicon gate. A contact is formed on the source and the drain region. A silicide is prevented from forming on the sacrificial polysilicon gate using at least one of the first and the second hard mask layers.

DETAILED DESCRIPTION

The present disclosure relates generally to forming an integrated circuit device on a substrate and, more particularly, to fabricating a gate structure of a semiconductor device (e.g., a gate of a FET device of an integrated circuit). It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Furthermore, included are descriptions of a first layer or feature "on," "overlying," and like descriptions, a second layer or feature. These terms include embodiments where the first and second layer are in direct contact and those where one or more layers or feature are interposing the first and second layer.

Figure 1:
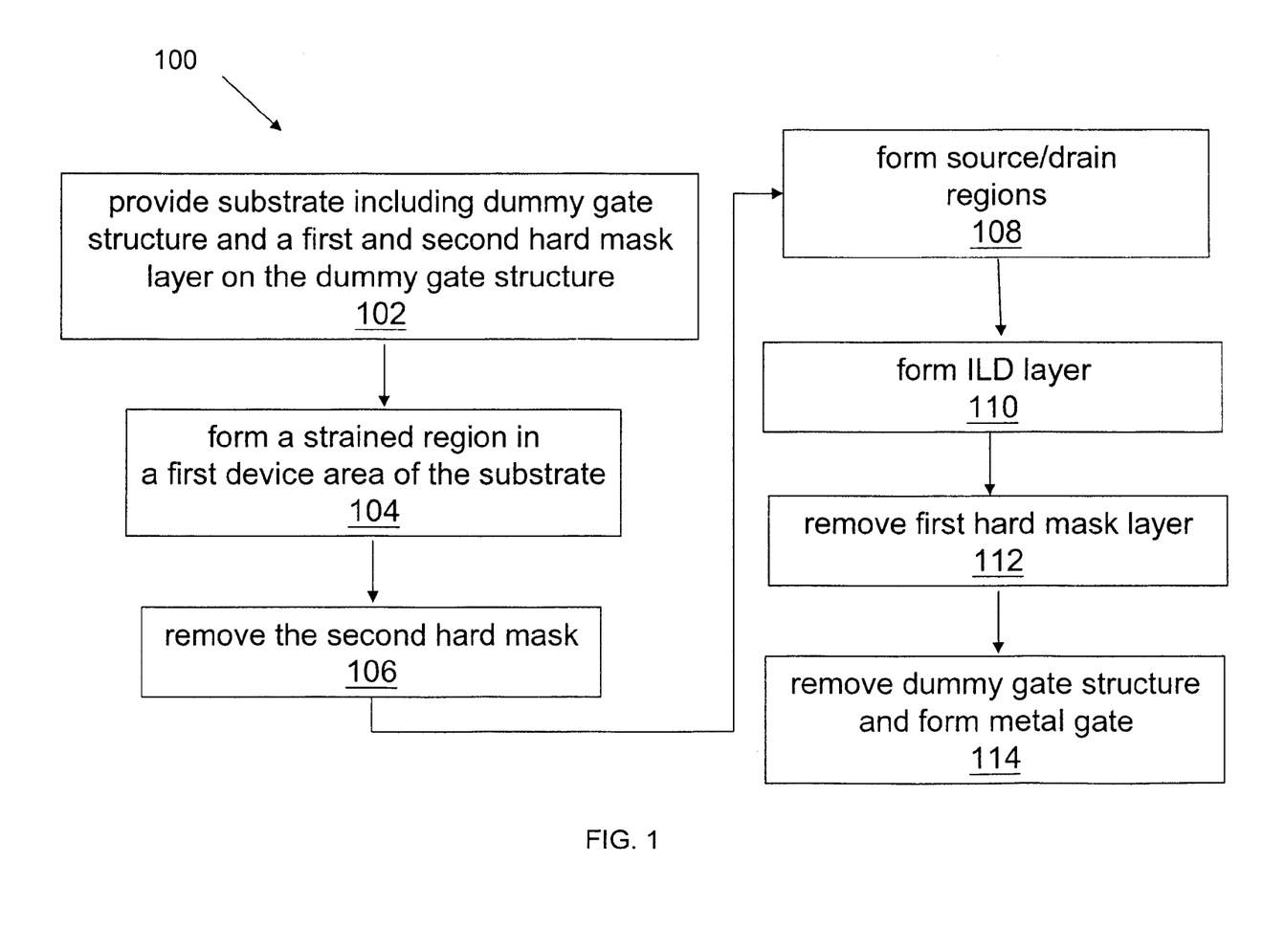
FIG. 1 is a flowchart illustrating an embodiment of a method of forming a gate structure.

Referring to FIG. 1, illustrated is a flowchart providing an embodiment of a method 100 of forming a gate structure. FIGS. 2-9 provide exemplary devices corresponding to fabrication steps of FIG. 1. The method 100 may be included during processing of an integrated circuit, or portion thereof, that may comprise static random access memory (SRAM) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and other suitable devices. The method 100 includes a gate-last process of fabricating a high-k metal gate structure.

The method 100 begins at step 102 where a semiconductor substrate (e.g., wafer) is provided. The substrate includes a dummy gate structure formed on the substrate. A first and second hard mask layer are formed on the dummy gate structure. The dummy gate structure may be a sacrificial polysilicon gate structure formed during a gate-last (metal gate) fabrication process. In an embodiment, the first hard mask layer includes SiN. In an embodiment, the second hard mask layer includes an oxide (e.g., silicon oxide). The first and/or second hard mask layers may be used as a masking element (e.g., pattern) in forming the dummy gate structure. For example, a layer of polysilicon may be deposited. A first hard mask layer and a second hard mask layer may be formed on the polysilicon layer. The first hard mask layer and/or the second hard mask layer may be patterned using processes such as, spin coating of photoresist, patterning the photoresist, etching the photoresist to provide a pattern, and using the photoresist pattern as a masking element to pattern the hard mask layer(s), for example, using an etching process, and/or other suitable processes.

Figure 2:
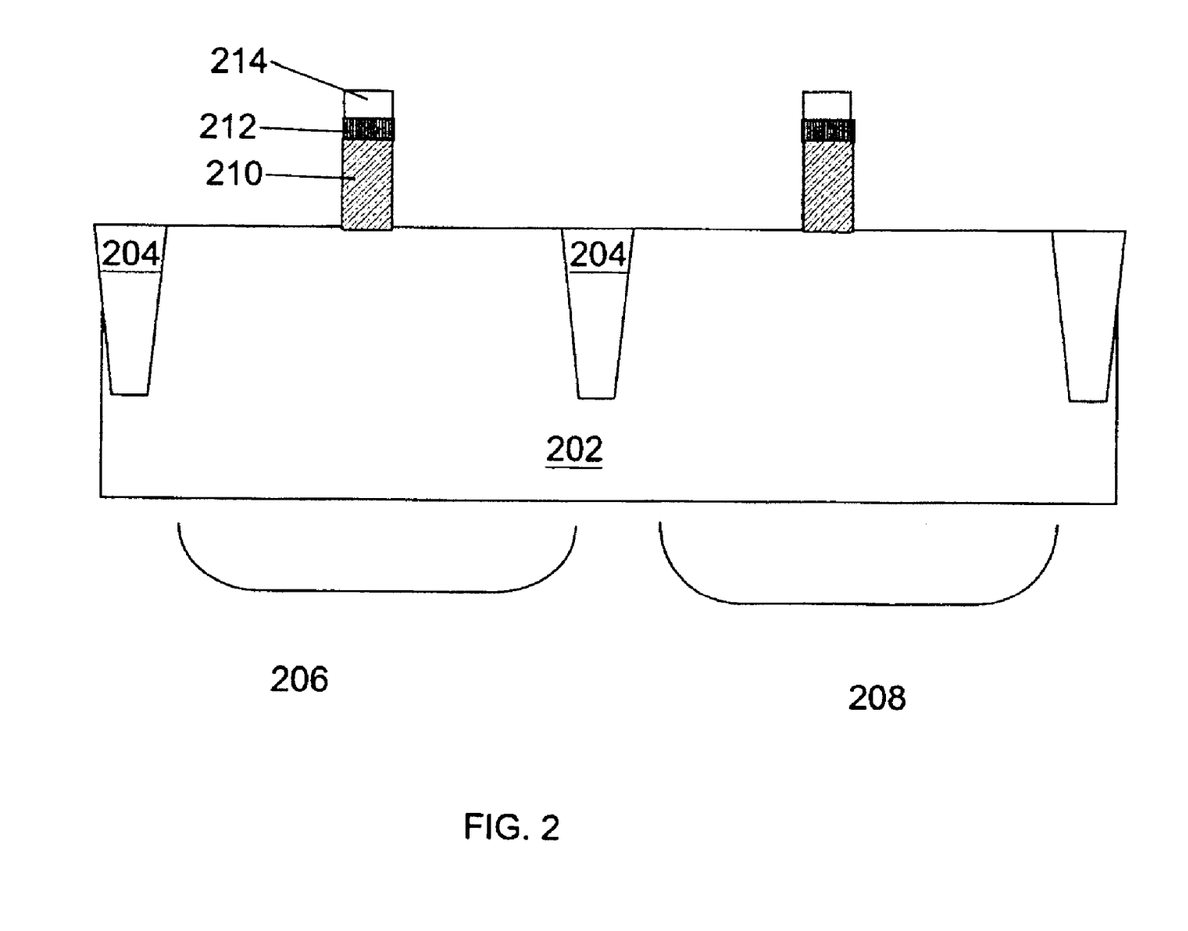
FIGS. 2-9 are cross-sectional views illustrating an embodiment of a substrate corresponding to steps of the method of FIG. 1.

In the example of FIG. 2, a substrate 202 is provided. In an embodiment, the substrate 202 includes a silicon substrate (e.g., wafer) in crystalline structure. The substrate 202 may include various doping configurations depending on design requirements as is known in the art (e.g., p-type substrate or n-type substrate). Other examples of the substrate 202 may include other elementary semiconductors such as germanium and diamond. Alternatively, the substrate 202 may include a compound semiconductor such as, silicon carbide, gallium arsenide, indium arsenide, or indium phosphide. Further, the substrate 202 may include an epitaxial layer (epi layer), may be strained for performance enhancement, and/or may include a silicon-on-insulator (SOI) structure. The substrate 202 includes a plurality of isolation regions, for example, shallow trench isolation (STI) structures 204. The STI structures 204 define a first device region 206 and a second device region 208. The STI structures 204 may include silicon oxide, silicon nitride, silicon oxynitride, fluoride-doped silicate glass (FSG), and/or a low-k dielectric material. Other isolation methods and/or features are possible in lieu of or in addition to STI. The STI structures 204 may be formed using processes such as reactive ion etch (RIE) of the substrate 202 to form trenches which are then filled with insulator material using deposition processes followed by CMP process.

In an embodiment, the first device region 206 includes a region for a PMOS device and the second device region 208 includes a region for an NMOS device, however any configuration may be possible. Dummy gate structures 210 are disposed on the substrate 202. The dummy gate structure 210 may include polysilicon. The dummy gate structure 210 may be formed using processes such as, deposition, photolithography (e.g., patterning using photoresist), etching, and/or other suitable processes. The dummy gate structure 210 may be formed (e.g., patterned) using a hard mask layer 212 and/or 214 as masking element(s).

A plurality of layers may underlie the dummy gate structure 210 including, for example, interface layers, gate dielectric layers, capping layers, and/or other suitable layers. An interface layer may include silicon, oxygen, and/or nitrogen. In an embodiment the interface layer is $SiO_2$. An interface layer may be formed by atomic layer deposition (ALD) or other suitable process. The gate dielectric layers includes a high-k (high dielectric constant) material. In an embodiment, the high-k dielectric material includes hafnium oxide ($HfO_2$). Other examples of high-k dielectrics include hafnium silicon oxide (HfSiO), hafnium silicon oxynitride (HfSiON), hafnium tantalum oxide (HfTaO), hafnium titanium oxide (HfTiO), hafnium zirconium oxide (HfZrO), combinations thereof, and/or other suitable materials. A capping layer may be formed on the gate dielectric layer. The capping layer may include a metal oxide layer such as, $La_2O_3$, DyO, $Al_2O_3$, and/or other suitable compositions. In an embodiment, a capping layer contributes to the work function of a subsequently formed metal gate.

In the example of FIG. 2, a first hard mask layer 212 and a second hard mask layer 214 are disposed on the dummy gate structure 210. In an embodiment, the first hard mask layer 212 includes SiN. In an embodiment, the second mask layer 214 includes an oxide.

The method 100 then proceeds to step 104 where a strained region is formed in the substrate. The strained region may provide for increased electron or hole mobility in the substrate. Thus, the regions may improve performance of the device with which they are associated. In an embodiment, a strained region is formed in a source/drain regions of a device, for example, a PMOS device. The strained region may include SiGe regions. The SiGe regions may be formed using epitaxial growth process. The strained region may be positioned adjacent to and spaced a distance from the dummy gate structure with which it is associated. Dummy spacer elements may be used to control the positioning of the strained region.

Figure 3:
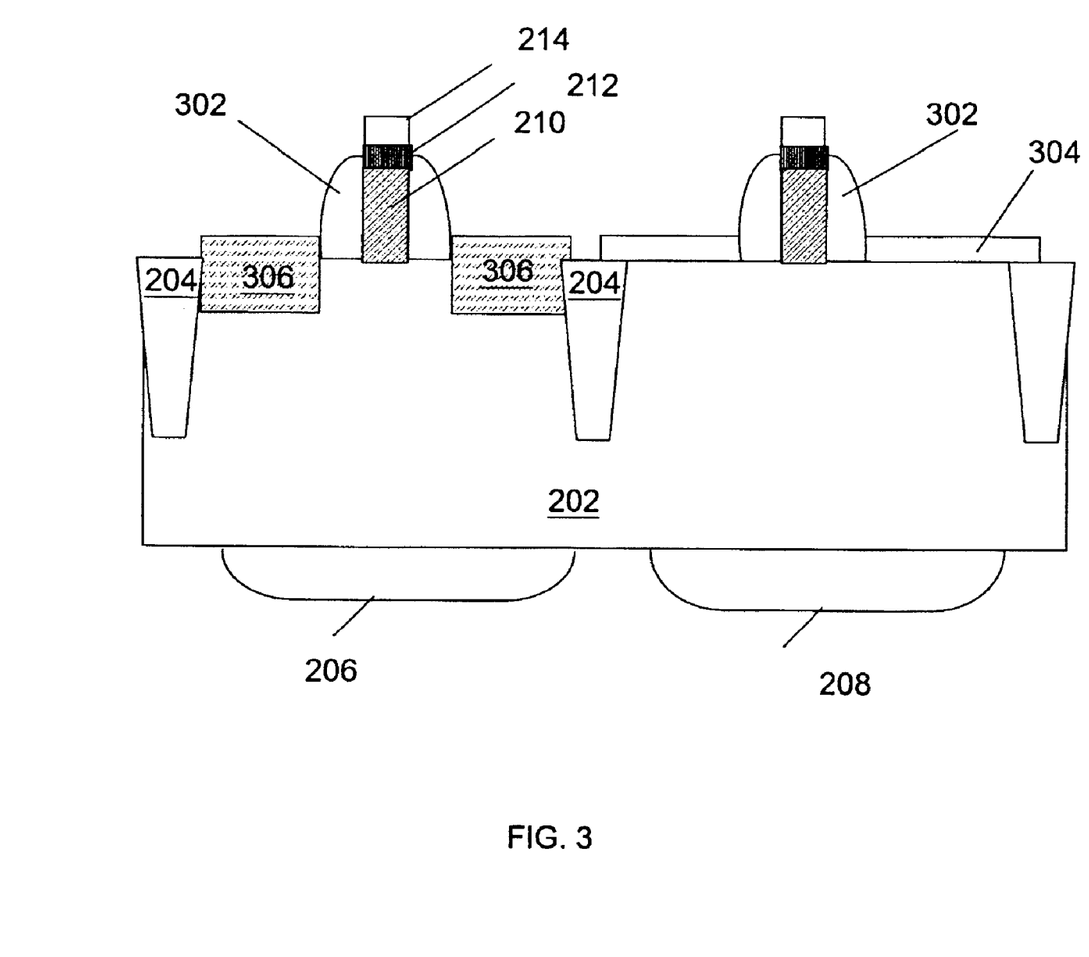
Figure 4:
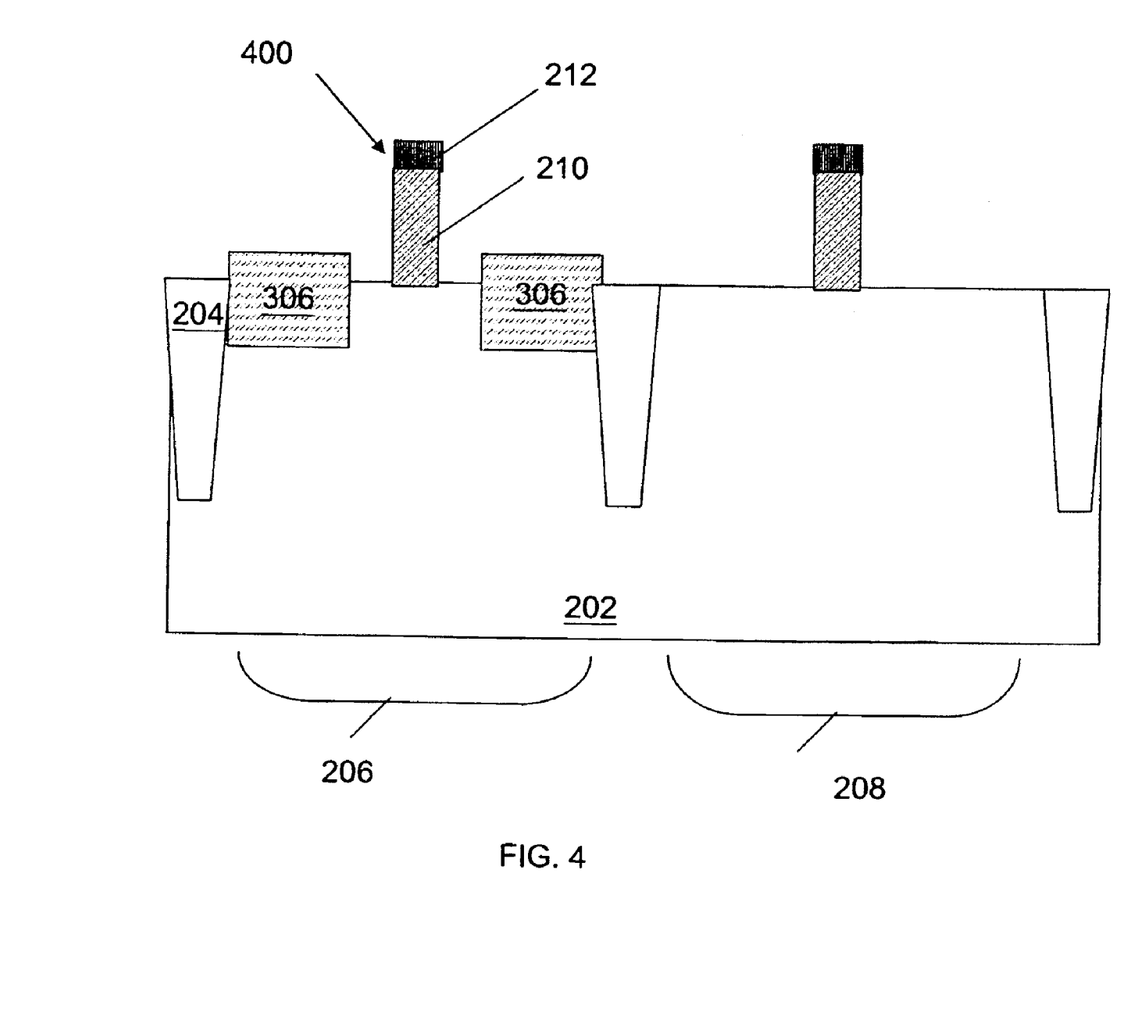

Referring to the example of FIG. 3, dummy spacer elements 302 are formed on the substrate 202. The device region 208 may be protected by dummy spacer elements and a masking layer 304. The masking layer 304 may be substantially similar to and formed simultaneously with the dummy spacer elements 302. The dummy spacer elements 302 may be formed on both sidewalls of the gate structure including the dummy gate structure 210 (and underlying layers). The dummy spacer elements 302 may be formed of silicon oxide, silicon nitride, silicon oxynitride, silicon carbide, fluoride-doped silicate glass (FSG), a low-k dielectric material, combinations thereof, and/or other suitable material. The dummy spacer elements 302 may have a multiple layer structure, for example, including one or more liner layers. The liner layers may include a dielectric material such as silicon oxide, silicon nitride, and/or other suitable materials. The dummy spacer elements 302 may be formed by methods including deposition of suitable dielectric material and anisotropically etching the material to form the dummy spacer element 302 profile.

Strained regions 306 are formed in the substrate 202 (e.g., in regions not masked by the masking layer 304 or the dummy spacer elements 302). The strained regions 306 may include SiGe, for example, epitaxial SiGe. As illustrated by FIG. 3, the dummy spacer elements 302 ensure that the strained regions 306 are offset from the dummy gate structure 210; the strained regions 306 are substantially aligned with the edge of the dummy spacer elements 302. In an embodiment, the strained regions 306 provide a strained region in which source/drain associated with a PMOS device of the first region 206 will be formed. The dummy spacer elements 302 may be sacrificial (e.g., removed following the growth of the strained region 306).

The method 100 then proceeds to step 106 where a hard mask layer, for example, the second hard mask layer provided above in step 102, is removed from the substrate. In an embodiment, a hard mask layer including oxide may be removed. The hard mask layer may be removed using a wet etch process, a dry etch process (e.g., RIE, plasma etching), and/or other suitable processes. Referring to the example of FIG. 4, the dummy spacer elements 302 (and the masking layer 304), described above with reference to FIG. 3, have been removed. The second hard mask layer 214 has been removed. The gate structure 400 includes the dummy gate structure 210 and the hard mask layer 212. Thus, the gate structure 400 may include a reduced height (e.g., from the gate structure including the dummy gate structure 210, the hard mask layer 212, and the hard mask layer 214, described above with reference to FIGS. 2 and 3).

The method 100 then proceeds to step 108 where source and drain regions are formed. The source/drain regions may be formed by implanting p-type or n-type dopants or impurities into the substrate depending on the desired transistor configuration. The source/drain features may be formed by methods including photolithography, ion implantation, diffusion, and/or other suitable processes. Step 108 may include one or more of the processes described below.

Step 108 may begin with the formation of low dose drain (LDD) regions. The LDD regions may be formed by implanting dopants into the substrate adjacent the gate structure(s). The height of the gate structure fabricated according to the method 100, described herein may have a decreased height. This decreased height may provide for a reduction of implantation shadowing effects during the LDD implant.

Following an LDD implant, if included, step 108 may include formation of spacer elements. The spacer elements may be formed on the sidewalls of the dummy gate structure and mask an LDD portion of the substrate. After the spacers are formed, a source and drain implant may be performed. The source and drain formation may include ion implantation of one or more dopants such as, boron, phosphorous, and/or other suitable dopants.

Figure 5:
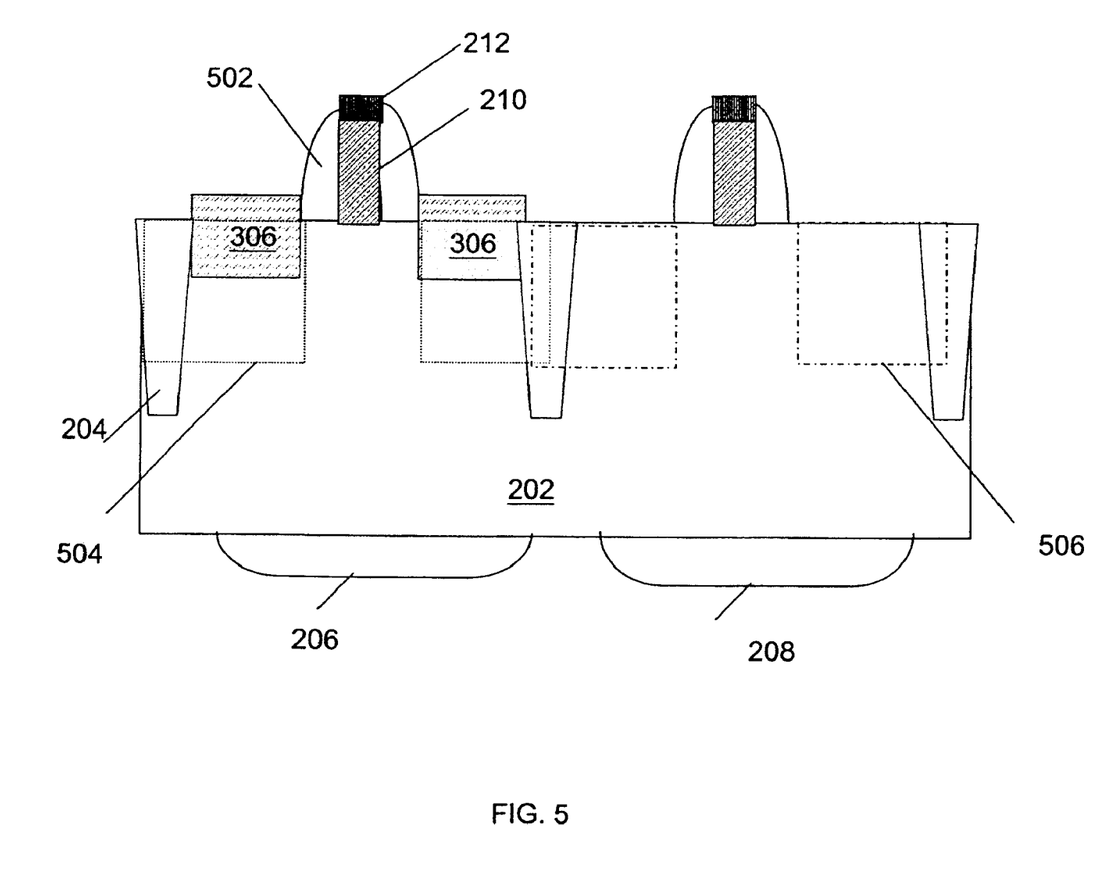
Figure 6:
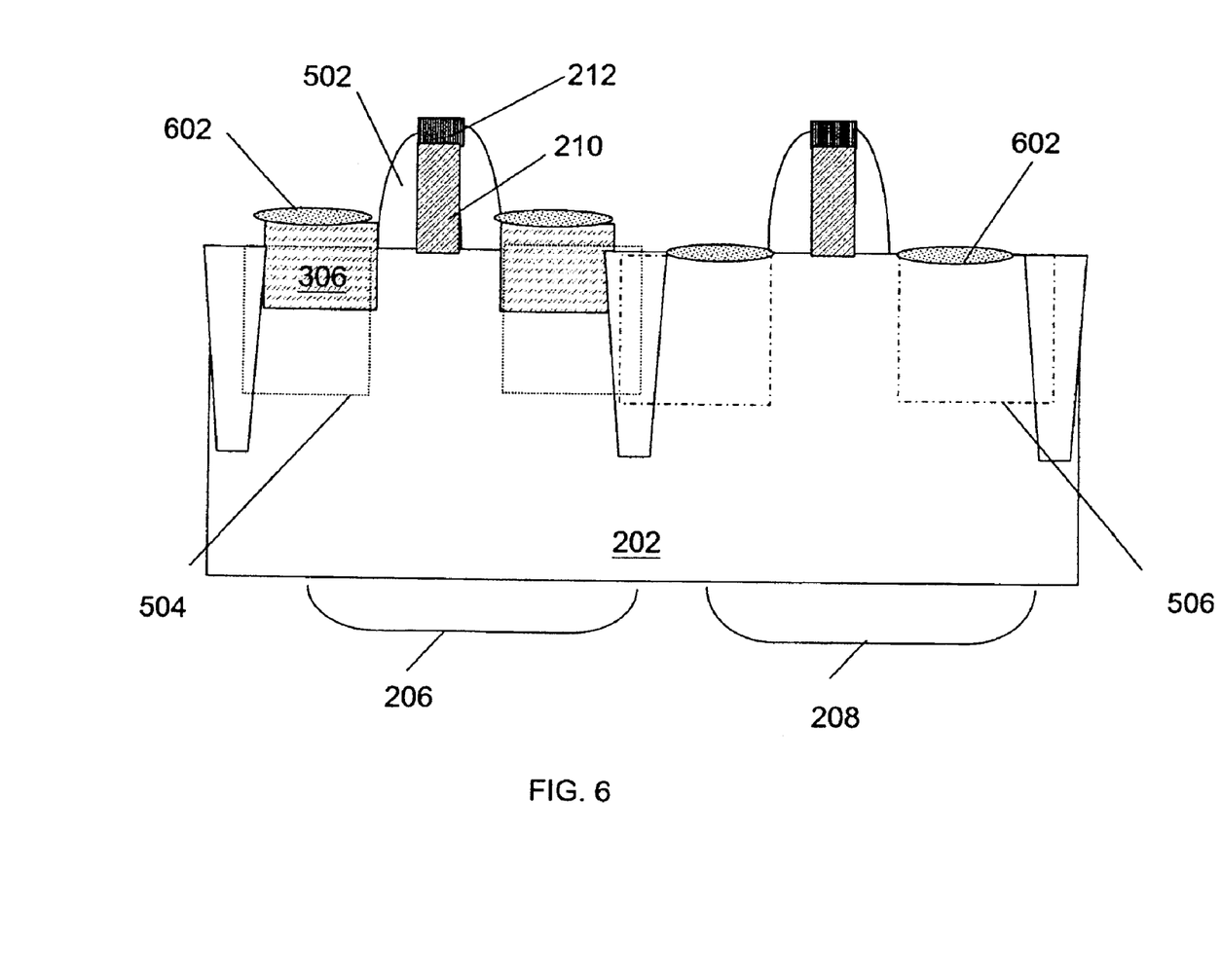
Figure 7:
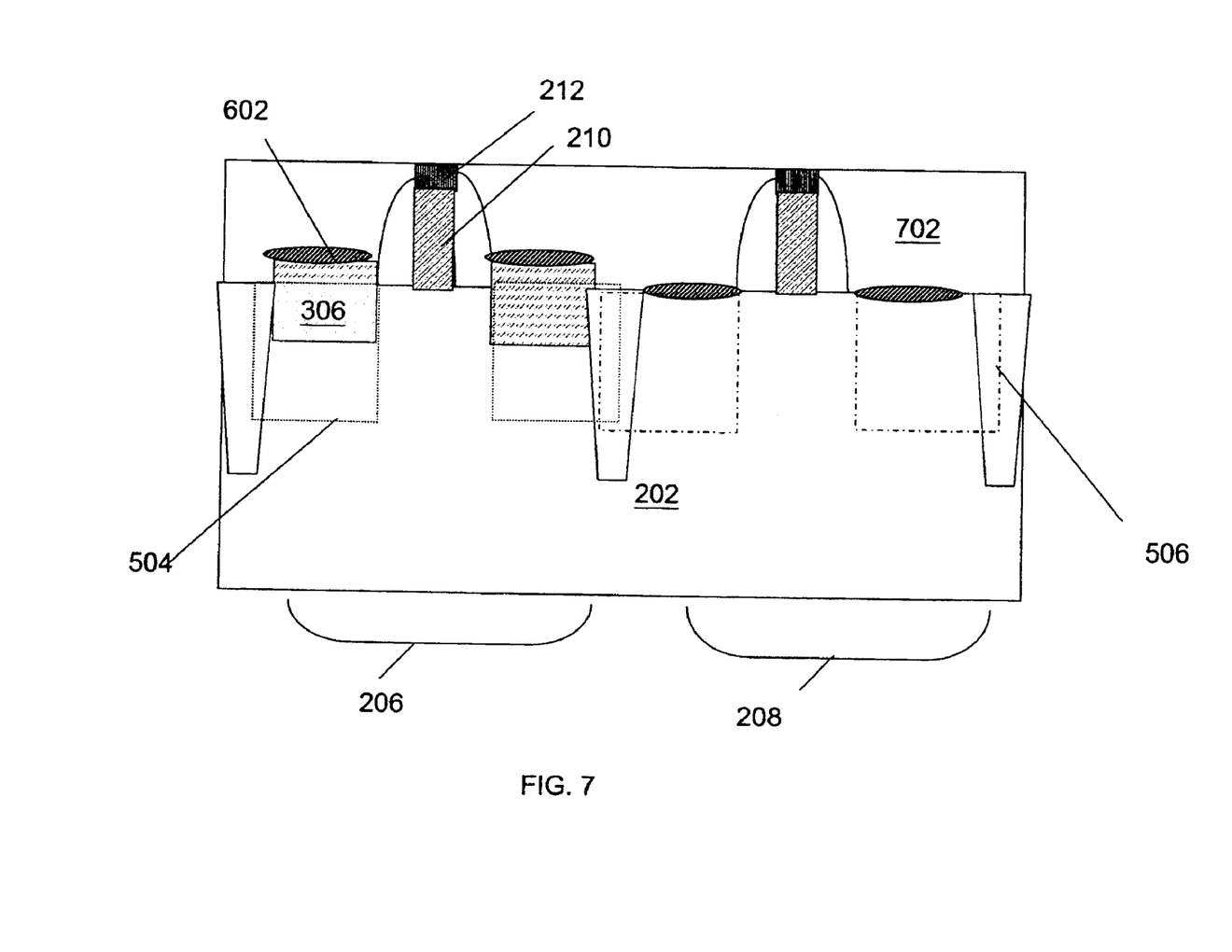
Figure 8:
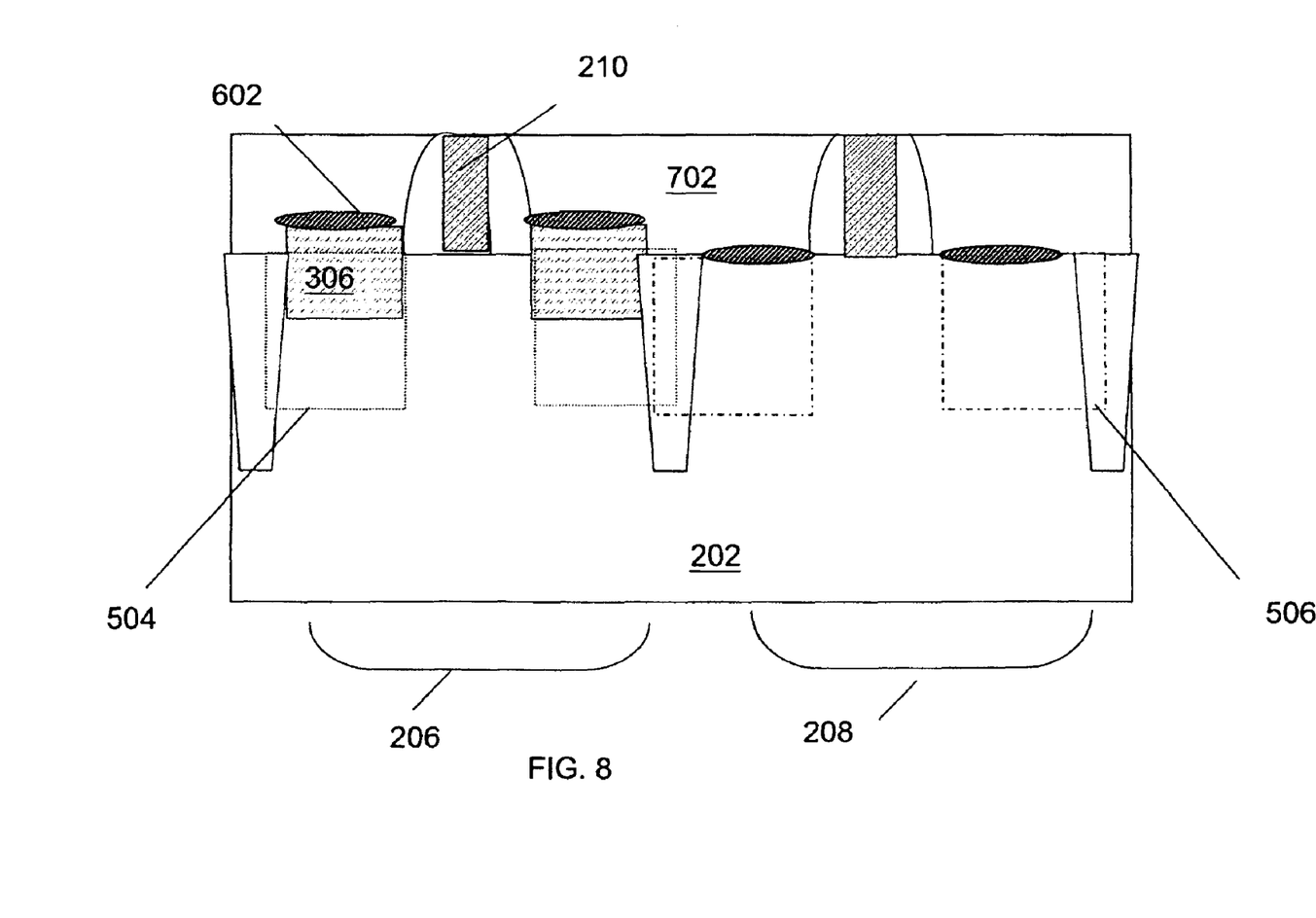

Referring to the example, of FIG. 5, after an LDD implant (if included), spacer elements 502 are formed on the substrate. The spacer elements 502 may be formed on both sidewalls of the gate structure including the dummy gate structure 210 (and underlying layers). The spacer elements 502 may be formed of silicon oxide, silicon nitride, silicon oxynitride, silicon carbide, fluoride-doped silicate glass (FSG), a low-k dielectric material, combinations thereof, and/or other suitable material. The spacer elements 502 may have a multiple layer structure, for example, including one or more liner layers. The liner layers may include a dielectric material such as silicon oxide, silicon nitride, and/or other suitable materials. The spacer elements 502 may be formed by methods including deposition of suitable dielectric material and anisotropically etching the material to form spacer element 502 profile. Source/drain regions 504 and 506 (e.g., doped areas of substrate provided by source/drain implant) are disposed within the substrate 202, substantially aligned with the spacer elements 502. In an embodiment, the source/drain regions 504 are associated with a PMOS device. The source/drain region 504 may include boron and/or other suitable p-type dopants. In an embodiment, the source/drain regions 506 are associated with an NMOS device. The source/drain region 506 may include phosphorous, arsenic, and/or other suitable n-type dopants. It should be noted that the source/drain implant 504 associated with a device in the region 206 of the substrate 202 is disposed, at least partially, within the strained region 306.

Step 108 may include forming contact features disposed on the source/drain regions. The contacts may include nickel silicide, cobalt silicide, tungsten silicide, tantalum silicide, titanium silicide, platinum silicide, erbium silicide, palladium silicide, or combinations thereof. Referring to the example of FIG. 6, contacts 602 are disposed on the substrate and provide contact to the source/drain regions 504 and 506. In an embodiment, the contacts 602 include nickel silicide. The contacts 602 may be formed on the source/drain regions 504 and/or 506 by a salicide (self-aligned silicide) process. The hard mask layer 212 may prevent silicide from forming on the dummy gate structure 210.

The method 100 then proceeds to step 110 where an interlayer dielectric (ILD) layer is formed on the substrate. A blanket layer of ILD material may be deposited. A chemical mechanical polish (CMP) process may then be used to planarize the ILD layer. In an embodiment, the first hard mask layer (described above with reference to FIG. 2) may be used as a stop layer for the CMP process. Referring to the example of FIG. 7, an ILD layer 702 is formed. The dielectric layer 702 may be formed by chemical vapor deposition (CVD), high density plasma CVD, spin-on, sputtering, or other suitable methods. The dielectric layer 702 may include silicon oxide, silicon oxynitride, or a low-k material. In an embodiment, the dielectric layer 702 is a high density plasma (HDP) dielectric. The hard mask layer 212 may be used as a stopping layer for CMP processes used to provide the dielectric layer 702. In an embodiment, the hard mask layer 212 is SiN. It is also noted that as the gate structure 400 includes the dummy gate structure 210 and the hard mask layer 212, the height of the gate structure 400 may provide a decreased aspect ratio of the opening between gate structures (e.g., the gap between the gate of the region 206 and the gate of the region 208 of the substrate 202). Thus, an improved gap fill (e.g., decreased voiding) of the ILD layer 702 may be provided.

The method 100 then proceeds to step 112 where the first hard mask layer is removed. In an embodiment, the hard mask layer is removed by continuing the CMP process described above in reference to step 110 (e.g., an over-polish step). Referring to the example of FIG. 8, the dielectric layer 702 has been removed such that the dielectric layer 702 is co-planar with the dummy gate structure 210. The hard mask layer 212 has been removed.

The method 100 then proceeds to step 114 where a metal gate structure is formed. The dummy gate structure, described above with reference to step 102, is removed from the substrate. The dummy gate structure may be removed using a wet etch, dry etch (e.g., RIE, plasma etch), and/or other suitable processes. Referring to the example of FIG. 9, the dummy gate structure 210 has been removed leaving trenches 902. Within the trenches 902, metal gate structures may be formed.

Figure 9:
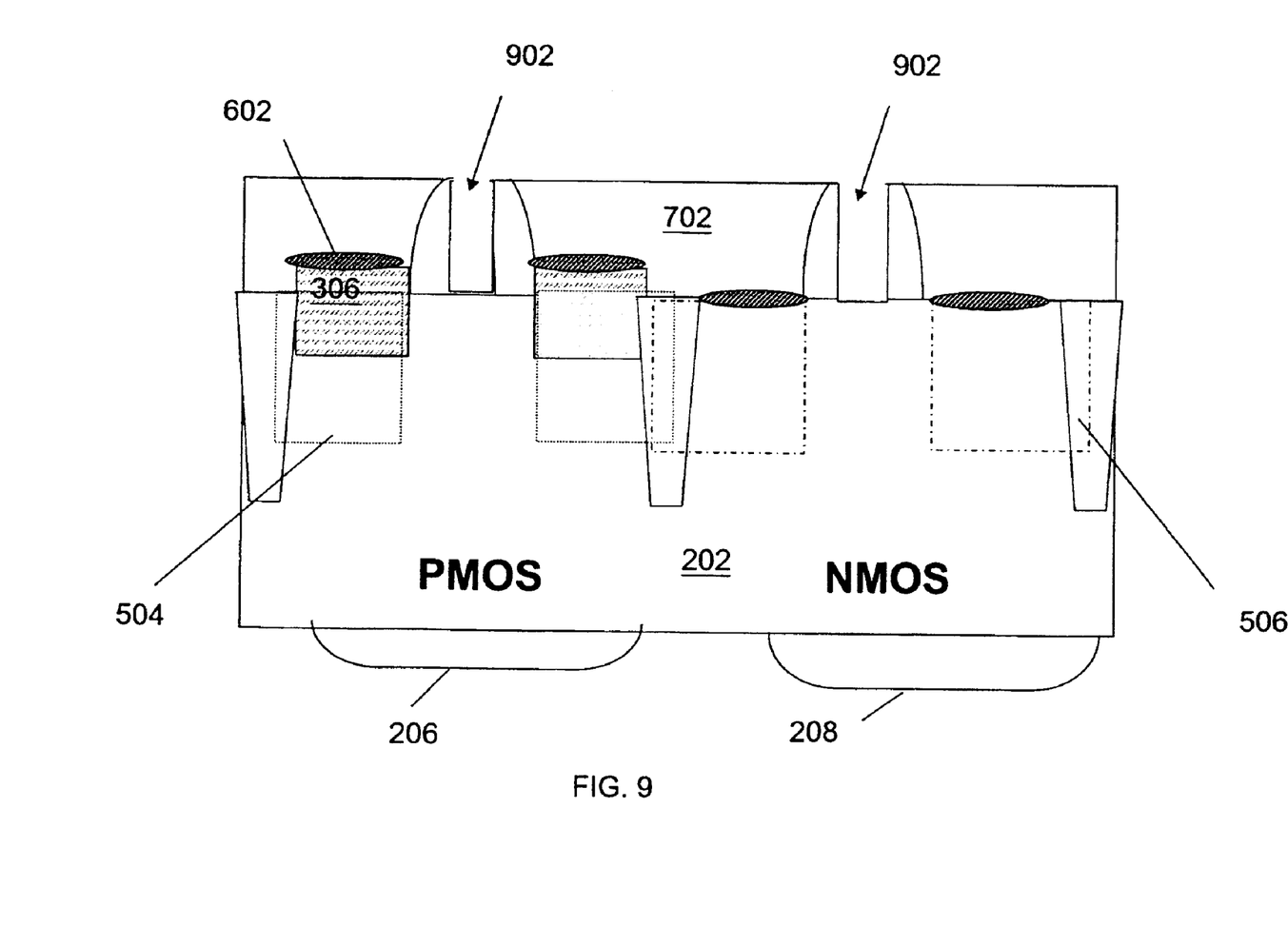

The metal gate may include one or more layers including Ti, TiN, TaN, Ta, TaC, TaSiN, W, WN, MoN, MoON, $RuO_2$, and/or other suitable materials. The gate may include one or more layers formed by PVD, CVD, ALD, plating, and/or other suitable processes. Examples of metals that may be deposited include p-type metal materials and n-type metal materials. P-type metal materials include compositions such as ruthenium, palladium, platinum, cobalt, nickel, and conductive metal oxides, and/or other suitable materials. N-type metal materials include compositions such as hafnium, zirconium, titanium, tantalum, aluminum, metal carbides (e.g., hafnium carbide, zirconium carbide, titanium carbide, aluminum carbide), aluminides, and/or other suitable materials. In an embodiment, a metal gate formed in the trench 902 of the region 208 of the substrate 202 includes an n-type metal. In an embodiment, a metal gate formed in the trench 902 of the region 206 of the substrate 202 includes a p-type metal. Other materials may deposited in addition to the work function metals (e.g., fill metals) and may include titanium nitride, tungsten, titanium, aluminum, tantalum, tantalum nitride, cobalt, copper, nickel, and/or other suitable materials. The metal gate may overlie and/or include capping layer(s), gate dielectric layer, interface layer, and/or other suitable layers.

In embodiments, the method 100 may continue to include further processing steps such as formation of interconnects, capping layers, and/or other suitable features.

In summary, method is provided for fabrication of a metal gate structure using a gate-last process. The method provides for a dummy gate structure that allows for improved ILD gap fill performance. The dummy gate stack also includes a height that prevents shadowing effects during implant processes (e.g., LDD). The method also provides for prevention of silicide formation on the dummy gate structure (e.g., on the sacrificial polysilicon). Silicide growth may provide CMP issues when planarizing an ILD layer. Finally, the method provides for a hard mask layer that is a good stop layer for a CMP process for planarizing an ILD layer.

While the preceding description shows and describes one or more embodiments, it will be understood by those skilled in the art that various changes in form and detail may be made therein without departing from the spirit and scope of the present disclosure. Therefore, the claims should be interpreted in a broad manner, consistent with the present disclosure.

What is claimed is:

1. A method of fabricating a semiconductor device, comprising:
   forming a first hard mask layer on a substrate;
   forming a second hard mask layer on the substrate and overlying the first hard mask layer;
   forming a dummy gate structure on the substrate using at least one of the first and the second hard mask layers to pattern the dummy gate structure;
   forming a spacer element adjacent the dummy gate structure;
   forming a strained region on the substrate adjacent the spacer element; and
   removing the second hard mask layer and the spacer element after forming the strained region.

2. The method of claim 1, wherein the forming the strained region includes forming the strained region abutting the spacer element.

3. The method of claim 1, further comprising:
   forming at least one of a source and a drain in the strained region.

4. The method of claim 1, wherein the forming the spacer element includes depositing a dielectric selected from the group consisting of silicon oxide, silicon nitride, silicon oxynitride, silicon carbide, fluoride-doped silicate glass (FSG), a low-k dielectric and combinations thereof.

5. The method of claim 1, wherein the forming the strained region includes epitaxially growing silicon germanium, wherein the growth is bounded by the spacer element in at least one direction.

6. The method of claim 1, wherein the spacer element includes an interface with the first hard mask layer.

7. A method of fabricating a semiconductor device, comprising:
   providing a substrate including a dummy gate structure disposed on the substrate;
   providing a first hard mask layer and a second hard mask layer on the dummy gate structure;
   forming a dummy spacer element abutting the dummy gate structure;
   forming a strained region on the substrate adjacent the dummy spacer element;
   removing the second hard mask layer after forming the strained region; and
   removing the dummy spacer element after forming the strained region.

8. The method of claim 7, wherein the forming the strained region includes forming an epitaxial region interfacing with the dummy spacer element.

9. The method of claim 7, further comprising:
   forming a drain region in the strained region after removing the dummy spacer element.

10. The method of claim 7, further comprising:
    forming a first drain region in the substrate after removing the dummy spacer element, wherein the first drain region is a low dose drain (LDD) region.

11. The method of claim 10, further comprising:
    forming a second spacer element after forming the first drain region, wherein the second spacer element abuts the dummy gate structure.

12. The method of claim 11, further comprising:
    implanting the strained region to form a second drain region after forming the second spacer element.

13. The method of claim 12, wherein the forming the first and the second drain regions include implanting p-type dopants.

14. The method of claim 7, further comprising:
    depositing a dielectric layer on the substrate; and
    removing at least a portion of the deposited dielectric layer using the first hard mask layer as a stop layer.

15. The method of claim 14, wherein the removing the at least a portion of deposited dielectric layer includes continuing processing past the stop layer to remove the first hard mask layer.

16. A method of fabricating a semiconductor device, comprising:
    forming a first hard mask layer and a second hard mask layer on a substrate;
    forming a sacrificial polysilicon gate on the substrate, wherein the forming the sacrificial polysilicon gate on the substrate includes using at least one of the first hard mask layer and the second hard mask layer to pattern the sacrificial polysilicon gate;
    forming sacrificial dummy spacer elements adjacent sidewalls of the sacrificial polysilicon gate; and
    removing the second hard mask layer and the sacrificial dummy spacer elements.

17. The method of claim 16, further comprising:
    forming an epitaxial region abutting the sacrificial dummy spacer elements.

18. The method of claim 17, further comprising:
    implanting the substrate in a space between the epitaxial region and the sacrificial polysilicon gate after the sacrificial dummy spacer elements are removed.

19. The method of claim 16, wherein the second hard mask layer and the sacrificial dummy spacer elements are removed concurrently.

20. The method of claim 16, further comprising:
    removing the sacrificial polysilicon gate from a region on the substrate and forming a metal gate electrode in the region.

* * * * *